United States Patent [19]

Wang et al.

[11] Patent Number: 6,119,338
[45] Date of Patent: Sep. 19, 2000

[54] METHOD FOR MANUFACTURING HIGH-DENSITY MULTILAYER PRINTED CIRCUIT BOARDS

[75] Inventors: Tsung-Hsiung Wang, Ta-Li; Man-Lin Chen, Miau-Li Hsien; Chuang-Shin Chiou, Chu-Pei; Ming-Shun Chan, Hsinchu; Pei-Wen Ding, Chia-Yi, all of Taiwan

[73] Assignee: Industrial Technology Research Institute, Hsinchu Hsien, Taiwan

[21] Appl. No.: 09/044,969

[22] Filed: Mar. 19, 1998

[51] Int. Cl.[7] .......................................... H01K 3/10
[52] U.S. Cl. .................. 29/852; 29/830; 29/832; 29/847; 174/261
[58] Field of Search .............................. 29/852, 848, 830, 29/832, 847; 174/264, 258, 262, 261; 156/150, 151; 361/792, 795

[56] References Cited

U.S. PATENT DOCUMENTS

| | | | |
|---|---|---|---|
| 4,915,983 | 4/1990 | Lake et al. | 427/98 |
| 5,092,032 | 3/1992 | Murakami | 29/830 |
| 5,293,025 | 3/1994 | Wang | 219/121.71 |
| 5,347,712 | 9/1994 | Yasuda et al. | 29/852 |
| 5,451,721 | 9/1995 | Tsukada et al. | 174/261 |
| 5,481,795 | 1/1996 | Hatakeyama et al. | 29/852 |
| 5,512,514 | 4/1996 | Lee | 437/195 |
| 5,558,928 | 9/1996 | Distefano et al. | 428/209 |
| 5,568,682 | 10/1996 | Gates, Jr. et al. | 29/831 |
| 5,640,761 | 6/1997 | Distefano et al. | 29/830 |
| 5,744,758 | 4/1998 | Takeenouchi et al. | 174/255 |
| 5,925,206 | 7/1999 | Boyko et al. | 156/150 |
| 5,960,538 | 10/1999 | Kawakita et al. | 29/847 |

FOREIGN PATENT DOCUMENTS

| | | | |
|---|---|---|---|
| 3-50893 | 3/1991 | Japan | 29/829 |
| 4-17385 | 1/1992 | Japan | 29/829 |

*Primary Examiner*—Lee Young
*Assistant Examiner*—Minh Trinh
*Attorney, Agent, or Firm*—W. Wayne Liauh

[57] ABSTRACT

A method for making high-density multilayer printed circuit boards is disclosed. It includes the steps of: (a) forming a pair of first conductive layers on top and bottom sides of a dielectric substrate; (b) forming first via holes through one of the first electrically conductive layers; (c) forming a blind hole through the dielectric substrate using a conformal laser drilling technique and filling the blind hole with an electrically conductive material; (d) forming a circuit pattern from the first electrically conductive layer; (e) forming a first electrically insulating layer on the first electrically conductive layer; (f) forming second via holes through the first electrically insulating layer using a non-conformal laser drilling technique; (g) forming a second electrically conductive layer covering the top surface of the circuit pattern, the first electrically insulating layer, and the side surface of the second via holes by electroplating; (h) forming a second electrically insulating layer on the first electrically conductive layer and filling the second via hole with the same electrically insulating material; (i) removing the second electrically insulating layer and the second electrically conductive layer above the second via hole; (j) forming a third electrically conductive layer on the first electrically insulating layer, wherein the third electrically conductive layer is in contact with the top edges of the second electrically conductive layer remaining on the cylindrical surface of the second via; (k) forming another circuit pattern on the third electrically conductive layer. Steps (e) through (k) can be repeated for more circuit patterns.

9 Claims, 5 Drawing Sheets

METHOD FOR MANUFACTURING HIGH-DENSITY MULTILAYER PRINTED CIRCUIT BOARDS

FIELD OF THE INVENTION

The present invention relates to a method for manufacturing high-density multilayer printed circuit boards. More specifically, the present invention relates to a lithophotographic method for manufacturing high-density multilayer printed circuit boards with landless interconnects which allows greater wiring design freedom and higher wiring density without incurring proportional increase in manufacturing cost.

BACKGROUND OF THE INVENTION

Conventionally, the interlayer connections in a multilayer printed circuit board are formed by drilling down one or more via holes through a dielectric layer of film to the next underlying circuit layer and filling the resulting via holes with a conductive material to connect two vertically isolated conductive layers. This process is repeated on one side of the insulation substrate to form a multilayer printed circuit board.

U.S. Pat. No. 5,092,032 discloses a method for manufacturing multilayer printed circuit boards which does not require the step of drilling through the dielectric layer and in which landless inter-layer connection is made between a lower-layer electric circuit and an upper-layer electric circuit formed on a substrate. This method, which utilizes a single photoresist to form a circuitization layer and the conductive via extending upwardly from the circuitization layer, involves forming a via bump in a photoresist hole. Such a via bump is suitable for transmitting power; it may experience at least some inconvenience in transmitting signals.

U.S. Pat. No. 5,451,721 discloses a method for manufacturing multilayer printed circuit by electrically connecting power conductors or ground conductors using through holes. Signal conductors in any two adjacent signal wiring layers are electrically connected using via holes extending only through an intervening electrically insulating layer. One of its limitations is that the electrically insulating layer must be a layer of photosensitive resin so that the via holes can be formed using conventional lithophotographic techniques.

SUMMARY OF THE INVENTION

The primary object of the present invention is to develop an improved method for manufacturing high-density multilayer printed circuit boards. More specifically, the primary object of the present invention is to develop an improved method that utilizes conventional techniques for manufacturing multilayer printed circuit boards with substantially increased wiring design freedom and wiring density without incurring substantially increased manufacturing cost.

In summary, the present invention utilizes the conventional lithophotographic technique in conjunction with conformal and non-conformal laser drilling techniques, to manufacture multilayer printed circuit boards which contain one or more electrically conductive, filled blind holes through the electrically insulating substrate to provide electrical connection between two sets of multilayer circuits on the two opposite sides of the dielectric substrate, so as substantially increase the wiring density and wiring design freedom. The method disclosed in the present invention comprises the following main steps:

(a) obtaining a dielectric substrate having first electrically conductive layers respectively provided on both sides thereof;

(b) using a combination of lithophotographic technique and etching to form at least one first via hole through each first electrically conductive layer;

(c) using a conformal laser drilling technique to form at least one blind hole through the dielectric substrate and filling the blind hole with an electrically conductive material;

(d) using a combination of lithophotographic technique and etching to form a predetermined circuit pattern on each first electrically conductive layer;

(e) forming a first electrically insulating layer on each first electrically conductive layer;

(f) using non-conformal laser drilling to form at least one second via hole through the first electrically insulating layer to expose a top surface of the circuit pattern;

(g) conformally coating a second electrically conductive layer covering the top surface of the circuit pattern, the top surface of the first electrically insulating layer, and the side surface of the second via, by electroplating;

(h) forming a second electrically insulating layer on the first electrically conductive layer and, at the same time, filling the second via with the same electrically insulating material;

(i) removing the second electrically insulating layer and the underlying second electrically conductive layer to expose the top edges of the second electrically conductive layer inside the second via hole;

(j) forming a third electrically conductive layer on the first electrically insulating layer, wherein the third electrically conductive layer is in contact with the top edges of the second electrically conductive layer inside the second via hole;

(k) using a combination of lithophotographic technique and etching to form another predetermined circuit wiring pattern on the third electrically conductive layer; and (l) repeating steps (e) through (k) if one or more electrically conductive layers are needed.

The use of the conformal and non-conform laser drilling to form the blind hole and the vias as disclosed in the present invention eliminates the need to use photosensitive insulating material in making vias, as taught by the prior art methods. This greatly enhances the wiring design freedom in manufacturing multilayer printed circuit boards. The use of conform laser drilling through the dielectric substrate to form the blind hole which is subsequently filled with an electrically conductive material also allows the wiring density to be essentially doubled without incurring large increase in the manufacturing cost.

BRIEF DESCRIPTION OF THE DRAWING

The present invention will be described in detail with reference to the drawing showing the preferred embodiment of the present invention, wherein.

DETAILED DESCRIPTION OF THE PREFERRED EMBODIMENT

Figure 1:
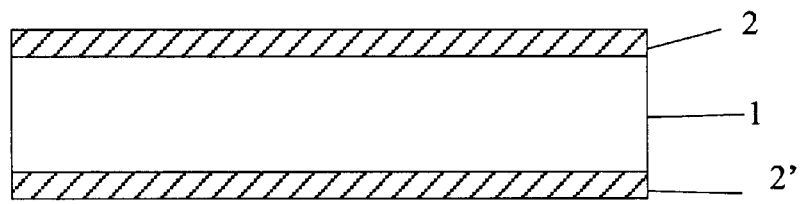
FIG. 1 shows two first electrically conductive layers formed on top and bottom of a dielectric substrate.

The present invention discloses an improved method that utilizes conventional lithophotographic techniques in conjunction with conformal and non-conformal laser drilling techniques, to manufacture multilayer printed circuit boards which contain one or more conductive filled blind holes through the electrically insulating substrate, so as substantially increase the wiring density and wiring design freedom. The method disclosed in the present invention comprises the following steps:

(a) forming a pair of first electrically conductive layers on a top and bottom sides of a dielectric substrate;

(b) forming at least one first via hole through each of the first electrically conductive layers;

(c) forming at least one blind hole through the dielectric substrate using a conformal laser drilling technique and filling the blind hole with an electrically conductive material;

(d) forming a predetermined wiring pattern from the first electrically conductive layer;

(e) forming a first electrically insulating layer on each first electrically conductive layer;

(f) forming at least one second via hole through the first electrically insulating layer using a non-conformal laser drilling technique, to expose a top surface of the wiring pattern;

(g) conformally forming a second electrically conductive layer on the top surface of the wiring pattern, the side surface of the second via hole and the top surface of the first electrically insulating layer by electroplating;

(h) forming a second electrically insulating layer on the second electrically conductive layer and, at the same time, filling the second via with the same electrically insulating material;

(i) removing the second electrically insulating layer and the second electrically conductive layer above the second via so as to expose the top edges of the second electrically conductive layer;

(j) forming a third electrically conductive layer on the first electrically insulating layer, wherein the third electrically conductive layer is in contact with the top edges of the second electrically conductive layer inside the second via;

(k) forming another predetermined wiring pattern from the third electrically conductive layer; and (l) repeating steps (e) through (k) if one or more wiring patterns are needed.

The use of the conformal and non-conform laser drilling to form the blind hole and the vias as disclosed in the present invention eliminates the need to use photosensitive insulating material in making vias, as taught by the prior art methods. This greatly enhances the wiring design freedom in manufacturing multilayer printed circuit boards. The use of conform laser drilling through the dielectric substrate also allows the wiring density to be essentially doubled without incurring large increase in the manufacturing cost.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

FIGS. 1 through 22 show a step-by-step procedure of the improved method of manufacturing high-density multilayer printed circuit board according to a preferred embodiment of the present invention.

FIG. 1 shows two first electrically conductive layers 2 and 2' on top and bottom of a dielectric substrate 1. The dielectric substrate can be FR-4 or FR-5 polyimide; it can also be plain or fiber-reinforced BT (bismaleimide triazine) or CE (cyanate ester) resin. The first electrically conductive layer was a copper layer having a thickness of 18 µm (weight 0.5 oz).

Figure 2:
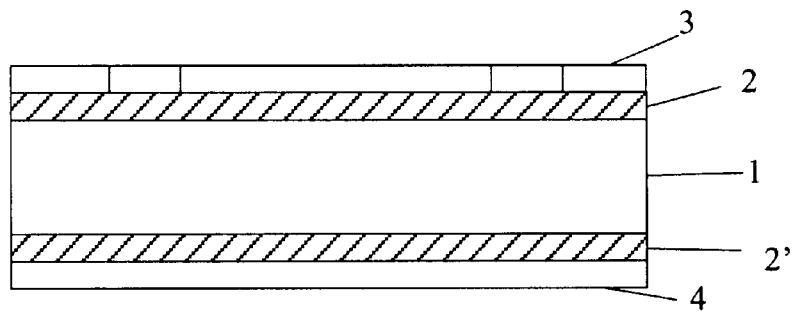
FIG. 2 shows that a pair of photoresist films were provided on top of the two first electrically conductive layers.

FIG. 2 shows that a pair of photoresist films 3 and 4 were provided on top of the two first electrically conductive layers 2 and 2', respectively, by lamination. The photoresist films were LAMINAR Aqueous Resist/Norton TB215-3005, laminated at a temperature of 105° C. and having a thickness of 0.8 mil.

Figure 3:
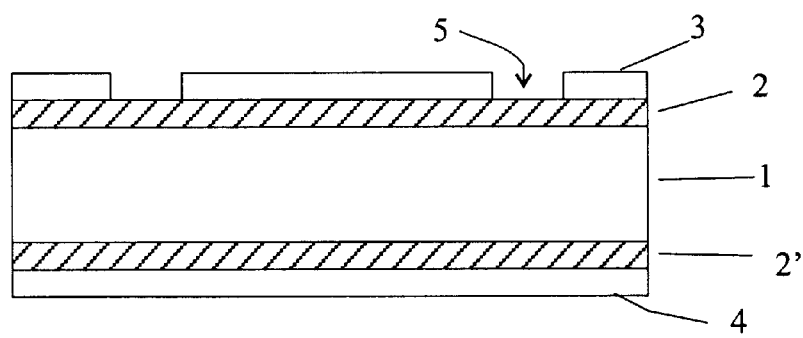
FIG. 3 shows a via pattern formed from the top photoresist film.

FIG. 3 shows a via pattern 5 formed from the top photoresist film 3. The via pattern was formed by a masked UV exposure (at an exposure energy of 35 mj/cm$^2$).

Figure 4:
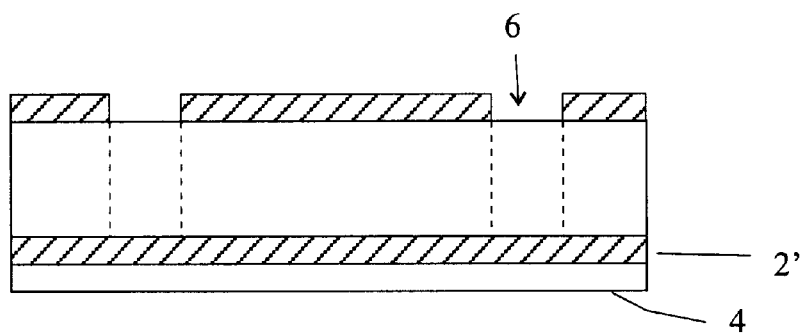
FIG. 4 shows that a via hole is formed from the first electrically conductive layer.

FIG. 4 shows that a pair of via holes 6 was formed through the first electrically conductive layer 2. The via holes were formed by etching the first electrically conductive layer 2 with a copper-etching solution, which can be ferric chloride, copper chloride, ammonium persulfate, or ammonium chloride solutions.

Figure 5:
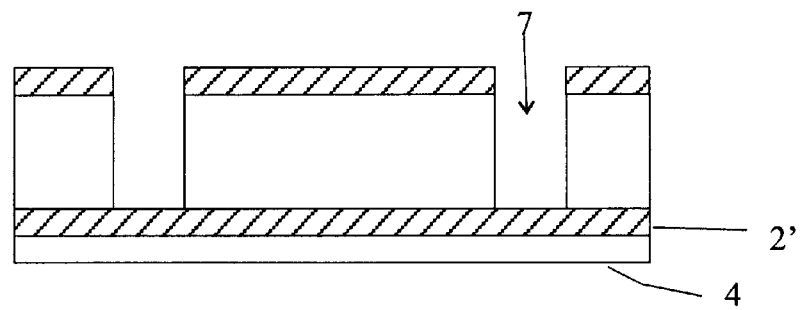
FIG. 5 shows a blind hole formed through the dielectric substrate.

FIG. 5 shows a blind hole 7 was formed through the dielectric substrate 1. The blind hole 7 was formed by a conformal laser drill technique, using a LUMONICS IMPACT GS-150 $CO_2$ laser drilling device and with the first electrically conductive layer 2 containing the via 6 as a mask.

Figure 6:
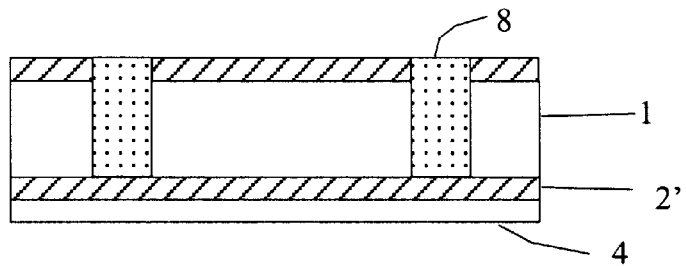
FIG. 6 shows that the blind hole was filled with an electrically conductive material.

FIG. 6 shows that the blind hole 7 was filled with an electrically conductive material to form a filled electrical passage 8.

Figure 7:
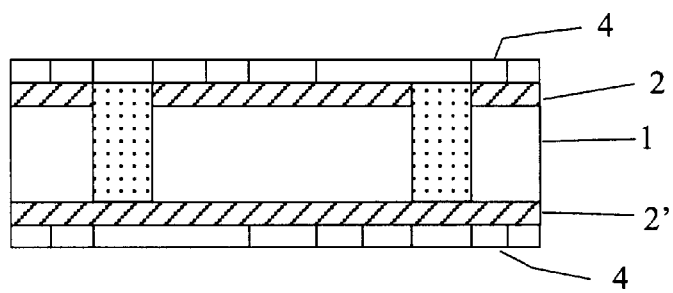
FIG. 7 shows that a photoresist layer was formed on the first electrically conductive layer.

FIG. 7 shows that the same photoresist 4 was formed on the first electrically conductive layer 2.

Figure 8:
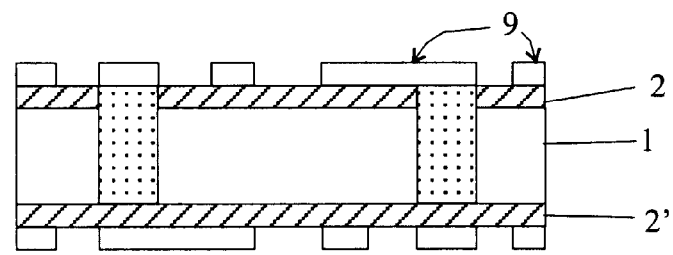
FIG. 8 shows that a predetermined wiring pattern was formed from the photoresist using a masked exposure.

FIG. 8 shows that a predetermined wiring pattern 9 was formed from the photoresist 4 using a masked exposure.

Figure 9:
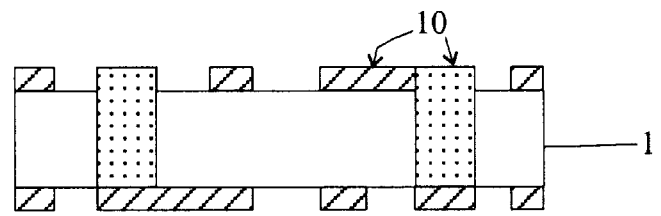
FIG. 9 shows that a predetermined electric circuit was formed from the first electrically conductive layer using the wiring pattern of the photoresist as a mask and an etching technique.

FIG. 9 shows that a first predetermined wiring pattern 10 was formed from the first electrically conductive layer using the wiring pattern of the photoresist 9 as a mask and an etching technique.

Figure 10:
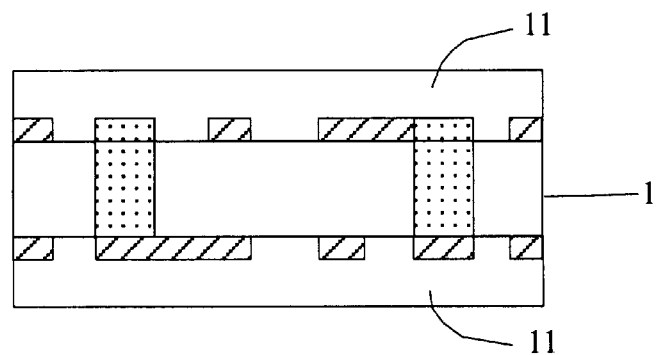
FIG. 10 shows that a first electrically insulating layer was formed on the first electrically conductive layer.

FIG. 10 shows that a first electrically insulating layer 11, which can be an epoxy resin or polyimide resin, was formed on the first electrically conductive layer, which is indicated in FIG. 10 as the first wiring pattern 10.

Figure 11:
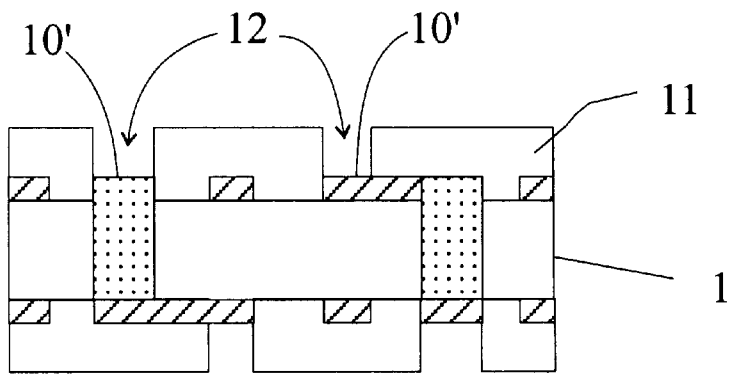
FIG. 11 shows that second vias hole was formed through the first electrically insulating layer to expose a top surface of the wiring pattern.

FIG. 11 shows that second via holes 12 were formed through the first electrically insulating layer 11 to expose a top surface 10' of the first wiring pattern 10. The second via holes were formed by a non-conformal laser drill technique, using a LUMONICS IMPACT GS-150 $CO_2$ laser drilling device. Other lasers such as YAG laser or Excimer laser can also be used in forming the vias.

Figure 12:
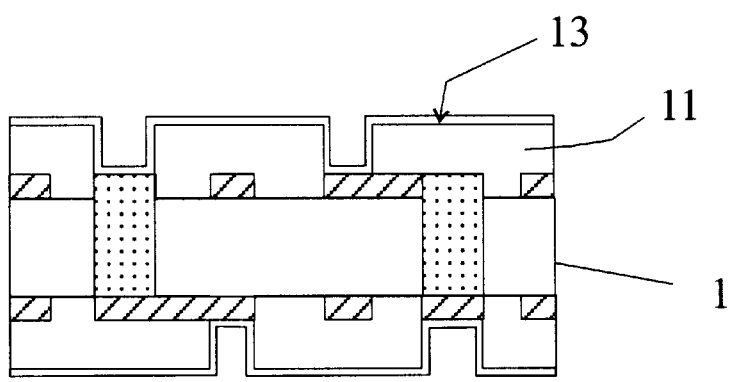
FIG. 12 shows that a second electrically conductive layer was conformally coated on the top surface of the wiring pattern inside the second via, the side surface of the second via hole, and the top surface of the first electrically insulating layer.

FIG. 12 shows that a second electrically conductive layer 13 was conformally coated on the top surface of the first wiring pattern 10', the cylindrically shaped side surface of the second via hole 12, and the top surface of the first electrically insulating layer, by electroplating.

Figure 13:
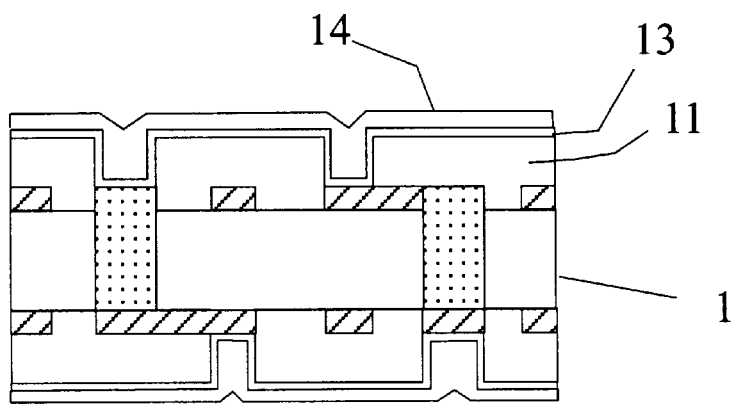
FIG. 13 shows that a second electrically insulating layer was formed covering the second electrically conductive layer as well as filling the second via hole.

FIG. 13 shows that a second electrically insulating layer 14 was deposited covering the first electrically conductive layer as well as filling the second via hole 12. Because of the small opening of the via hole 12 and the high viscosity of the resin, it was necessary to adjust the viscosity of the resin as well as using vacuum to fill the second via 12.

Figure 14:
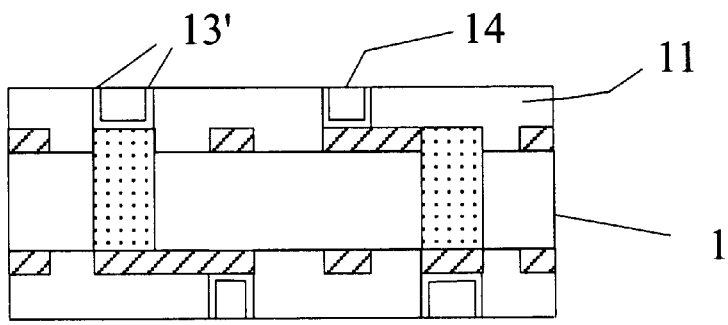
FIG. 14 shows that the second electrically insulating layer and the second electrically conductive layer above the top of second via hole were removed allowing the top edges of the second electrically conductive layer to be exposed.

FIG. 14 shows that the second electrically insulating layer 14 and the second electrically conductive layer 13 above the via hole were removed, exposing the top edges 13' of the U-shaped second electrically conductive layer. The portions of the second insulating layer 14 and the second electrically conductive layer 13 above the via hole 12 were removed using a belt sander or a brush polishing machine.

Figure 15:
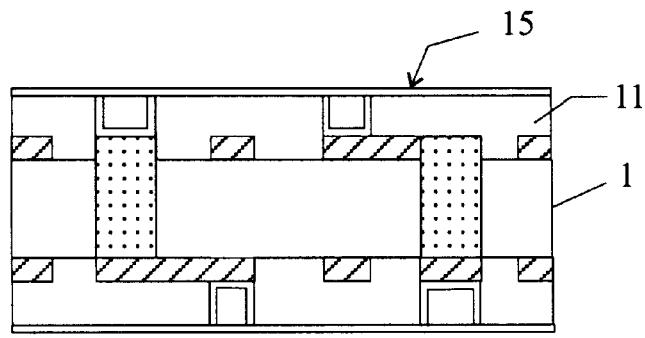
FIG. 15 shows that a third electrically conductive layer was formed on the first electrically insulating layer.

FIG. 15 shows that a third electrically conductive layer 15 was formed on the first electrically insulating layer 11 (since the second conductive and second insulating layers have been removed) by either chemical vapor deposition or electroplating technique. After the removal of the upper portion of the second electrically insulating layer 14, the remaining portion assumed the shape of a cup filling the second via hole, and the third electrically conductive layer 15 was formed in such a manner that it was in continuum with the top edges 13' of the now cup-shaped, or cylindrical, second electrically conductive layer coated on the side surface of the second via hole 12.

Figure 16:
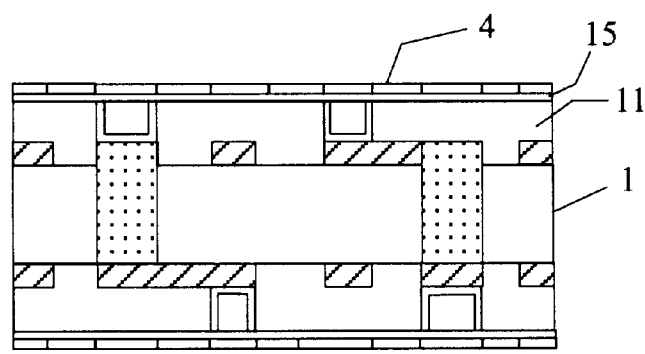
FIG. 16 shows that a photoresist was formed on the third electrically conductive layer.

FIG. 16 shows that a photoresist 4 was formed on the third electrically conductive layer 15 by lamination.

Figure 17:
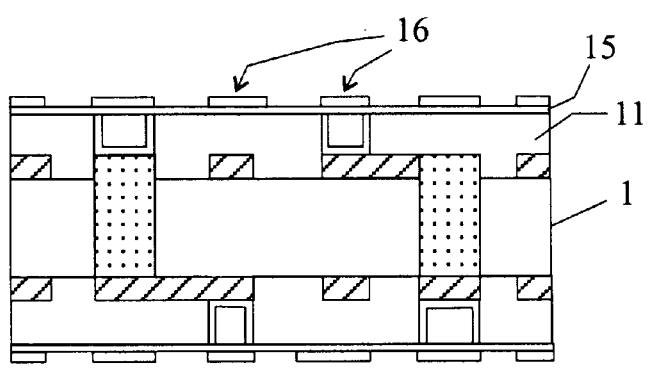
FIG. 17 shows that another wiring pattern was developed from the photoresist formed in FIG. 16 through a masked exposure procedure.

FIG. 17 shows that another wiring pattern 16 was developed on the photoresist 4 through a masked exposure.

Figure 18:
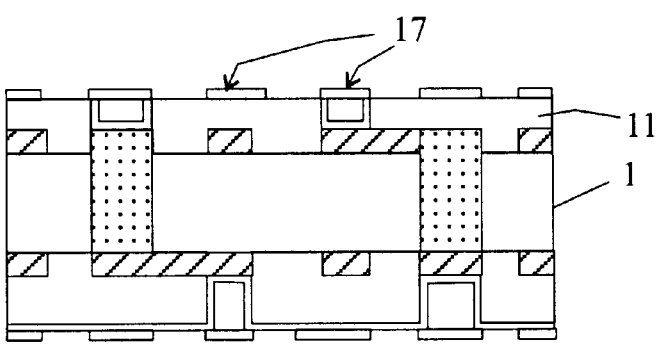
FIG. 18 shows that the photoresist wiring pattern was transferred to the third electrically conductive layer to form the same wiring pattern.

FIG. 18 shows that the photoresist wiring pattern 16 was transferred onto the third electrically conductive layer to form a second wiring pattern 17, the second wiring pattern 17 is in contact with the top edges 13' of the second electrically conductive layer, which, in turn, is in contact with the first wiring 10'.

Steps that are described in FIGS. 10 through 18 can be repeated to provide additional layers of circuitry. The outermost, or the surface, layer can be formed in a slightly modified procedure. This is described in FIGS. 19–22.

Figure 19:
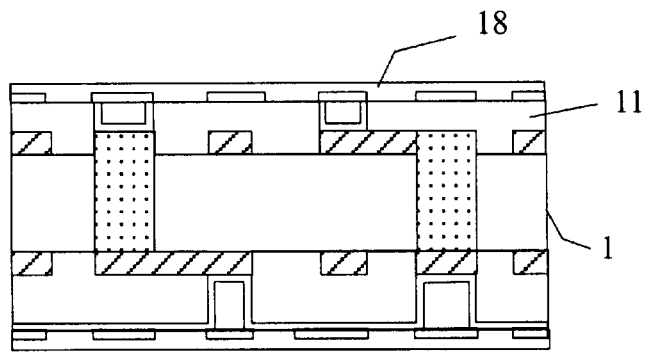
FIG. 19 shows that a final electrically insulating layer was formed covering the wiring circuit.

FIG. 19 shows that an electrically insulating layer 18 was formed covering the wiring circuit 17.

Figure 20:
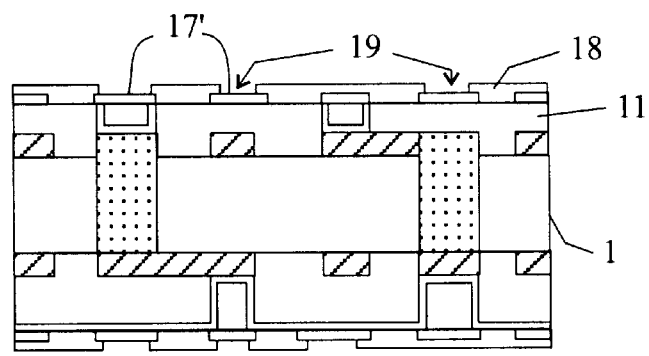
FIG. 20 shows that final vial holes are formed through the electrically insulating layer exposing a top surface of the third electrically conductive layer.

FIG. 20 shows that "final" via holes 19 are formed through the electrically insulating layer 18 by a non-conformal $CO_2$ laser drilling to expose a top surface 17' of the second wiring pattern 17.

Figure 21:
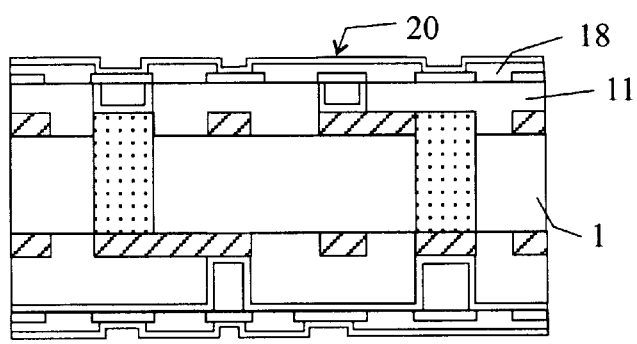
FIG. 21 shows that a final electrically conductive layer was conformally coated on the top surface of the third electrically conductive layer and the side surface of the final via holes.

FIG. 21 shows that a "final" electrically conductive layer 20 was conformally coated on the top surface 17' of the second wiring pattern, the side surface of the via 19, and the top surface of the electrically insulating layer 18.

Figure 22:
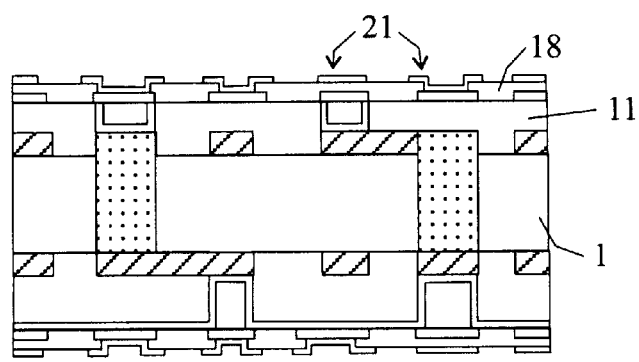
FIG. 22 shows that a fine-wiring circuit was formed of the final electrically conductive layer.

FIG. 22 shows that a fine-wiring circuit 21 was formed on the electrically conductive layer 20 using any fine-wiring technique.

By utilizing a combination of well-known techniques, including electroplating, photolithography, conformal and non-conformal laser drilling, the method disclosed in the present invention has been able to manufacture multilayer printed circuit boards with substantially increased wiring density and wiring design freedom. All these advantages were obtained without substantially increasing the manufacturing cost.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for making high-density multilayer printed circuit boards comprising the following steps:

(a) forming a pair of first electrically conductive layers on top and bottom sides of a dielectric substrate;

(b) forming at least one first via hole through one of said first electrically conductive layers;

(c) forming at least one blind hole through said dielectric substrate in alignment with said through hole using a conformal laser drilling technique and filling said blind hole with an electrically conductive blind hole filling material;

(d) forming a circuit pattern from said first electrically conductive layer;

(e) forming a first electrically insulating layer on said first electrically conductive layer;

(f) forming at least one second via through said first electrically insulating layer using a non-conformal laser drilling technique to expose a top surface of said circuit pattern;

(g) conformally coating a second electrically conductive layer covering said top surface of said circuit pattern, a side surface of said second via hole, and a top surface of said first electrically insulating layer, by electroplating;

(h) forming a second electrically insulating layer on said second electrically conductive layer and, at the same time, filling said second via hole with the same electrically insulating material;

(i) removing said second electrically insulating layer and said second electrically conductive layer above said second via hole to cause said second electrically conductive layer to assume the shape of a cup and expose top edges of said second electrically conductive layer;

(j) forming a third electrically conductive layer on said first electrically insulating layer, wherein said third electrically conductive layer is in contact with said top edges of said second electrically conductive layer so that it is electrically connected to said circuit pattern;

(k) forming another circuit pattern from said third electrically conductive layer; and (l) repeating steps (e) through (k) if one or more electrically conductive conductive patterns are needed.

2. The method for making high-density multilayer printed circuit boards according to claim 1 wherein said blind hole is formed using a conformal carbon dioxide laser drilling technique.

3. The method for making high-density multilayer printed circuit boards according to claim 1 wherein said via holes in the dielectric layers are formed using a non-conformal carbon dioxide laser, a YAG laser or an excimer laser.

4. The method for making high-density multilayer printed circuit boards according to claim 1 wherein said electrically conductive layer is a copper layer.

5. The method for making high-density multilayer printed circuit boards according to claim 1 wherein said dielectric substrate is an epoxy resin, a polyimide resin, a bismaleimide triazine resin, or a cyanate ester.

6. The method for making high-density multilayer printed circuit boards according to claim 1 wherein said dielectric substrate is a glass fiber reinforced epoxy resin, a polyimide resin, a bismaleimide triazine resin, or a cyanate ester.

7. The method for making high-density multilayer printed circuit boards according to claim 1 wherein said electrically conductive blind hole filling material is an organic material, an inorganic material, or a metal-based gelatinous material.

8. The method for making high-density multilayer printed circuit boards according to claim 1 wherein said circuit pattern on said electrically conductive layer is formed using a combination of a lithophotographic technique and etching.

9. The method for making high-density multilayer printed circuit boards according to claim 8 wherein said lithophotographic technique utilizes a positive or negative photoresist.

* * * * *